(12) United States Patent
Cernea

(10) Patent No.: US 7,173,860 B2
(45) Date of Patent: Feb. 6, 2007

(54) SOURCE CONTROLLED OPERATION OF NON-VOLATILE MEMORIES

(75) Inventor: Raul-Adrian Cernea, Santa Clara, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/201,000

(22) Filed: Aug. 9, 2005

(65) Prior Publication Data

US 2006/0018184 A1    Jan. 26, 2006

Related U.S. Application Data

(63) Continuation of application No. 10/600,988, filed on Jun. 20, 2003, now Pat. No. 6,950,348.

(51) Int. Cl.
G11C 11/34    (2006.01)

(52) U.S. Cl. ............................. 365/185.28; 365/185.24

(58) Field of Classification Search ........... 365/185.28, 365/185.24
See application file for complete search history.

(56) References Cited

U.S. PATENT DOCUMENTS

| | | | |
|---|---|---|---|
| 5,095,344 A | | 3/1992 | Harari |
| 5,313,421 A | | 5/1994 | Guterman et al. |
| 5,412,601 A | | 5/1995 | Sawada et al. |
| 5,590,076 A | | 12/1996 | Haddad et al. |
| 5,712,180 A | | 1/1998 | Guterman et al. |
| 5,757,700 A | | 5/1998 | Kobayashi |
| 5,847,998 A | * | 12/1998 | Van Buskirk ......... 365/185.33 |
| 5,986,941 A | | 11/1999 | Pang et al. |
| 6,084,262 A | | 7/2000 | Chi |
| 6,091,633 A | | 7/2000 | Cernea et al. |
| 6,151,248 A | | 11/2000 | Harari et al. |
| 6,222,771 B1 | | 4/2001 | Tang et al. |
| 6,345,000 B1 | * | 2/2002 | Wong et al. ........... 365/185.29 |
| 6,493,269 B1 | | 12/2002 | Cernea |
| 6,660,585 B1 | | 12/2003 | Lee et al. |
| 6,931,498 B2 | * | 8/2005 | Talreja et al. ............... 711/154 |
| 2002/0105036 A1 | | 8/2002 | Wang et al. |
| 2002/0105834 A1 | | 8/2002 | Chen |
| 2002/0118574 A1 | | 8/2002 | Gongwer et al. |
| 2002/0181266 A1 | | 12/2002 | Harari et al. |
| 2003/0048660 A1 | * | 3/2003 | Nguyen et al. ........ 365/185.11 |
| 2003/0058688 A1 | * | 3/2003 | Nguyen ................. 365/185.11 |

FOREIGN PATENT DOCUMENTS

EP    0 778 583 A2    6/1997

OTHER PUBLICATIONS

EPO, Communication, mailed in corresponding PCT/US2004/019347 on Apr. 21, 2006, 4 pages.
EPO/ISA, "Notification of Transmittal of the International Search Report and the Written Opinion of the International Searching Authority, or the Declaration", mailed in corresponding PCT/US2004/019347 on Jan. 24, 2005, 13 pages.

* cited by examiner

*Primary Examiner*—Michael Tran
(74) *Attorney, Agent, or Firm*—Parsons Hsue & de Runtz LLP

(57) ABSTRACT

Non-volatile memory such as flash EEPROM has memory cells that may be programmed in parallel using a self-limiting programming technique. Individual cells have charge storage units that may be charged by hot electrons in a self-limiting manner. As the charge storage unit reaches the required level of charge, hot electrons are no longer generated, or are generated in reduced number. The level of charge at which hot electron generation stops is determined by the voltage applied to the cell. Thus, several cells may be programmed in parallel, each self-limiting at a charge level corresponding to the voltage applied.

15 Claims, 6 Drawing Sheets

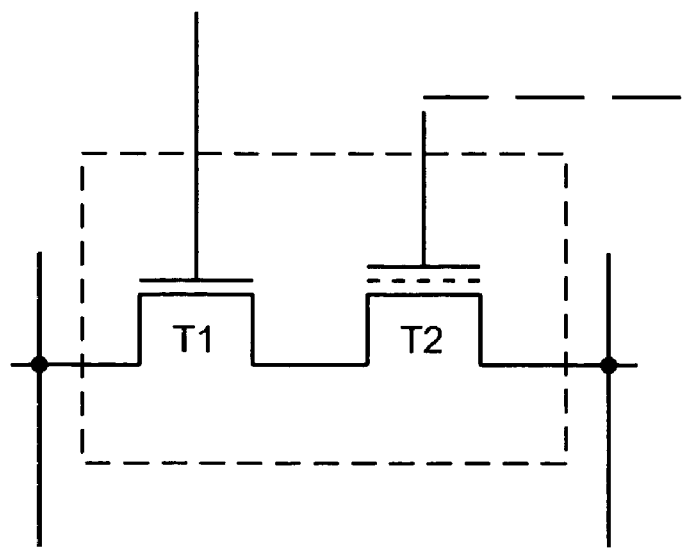
FIG._1a
*(PRIOR ART)*
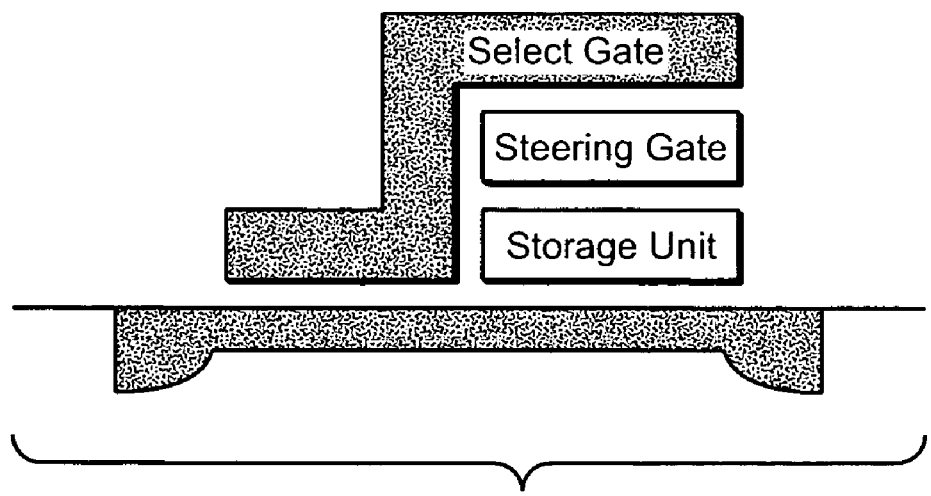
FIG._1b
*(PRIOR ART)*

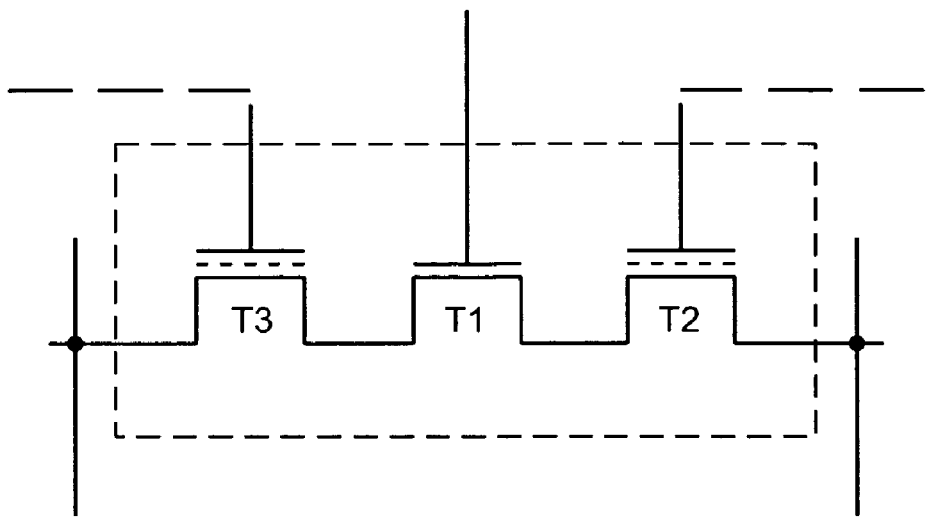
FIG._2a
*(PRIOR ART)*
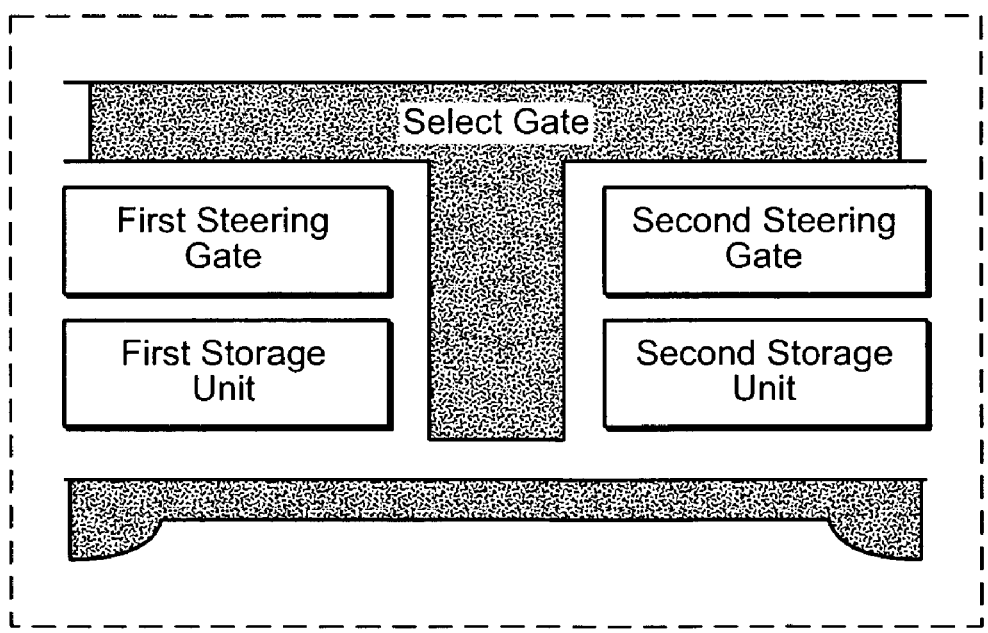
FIG._2b
*(PRIOR ART)*

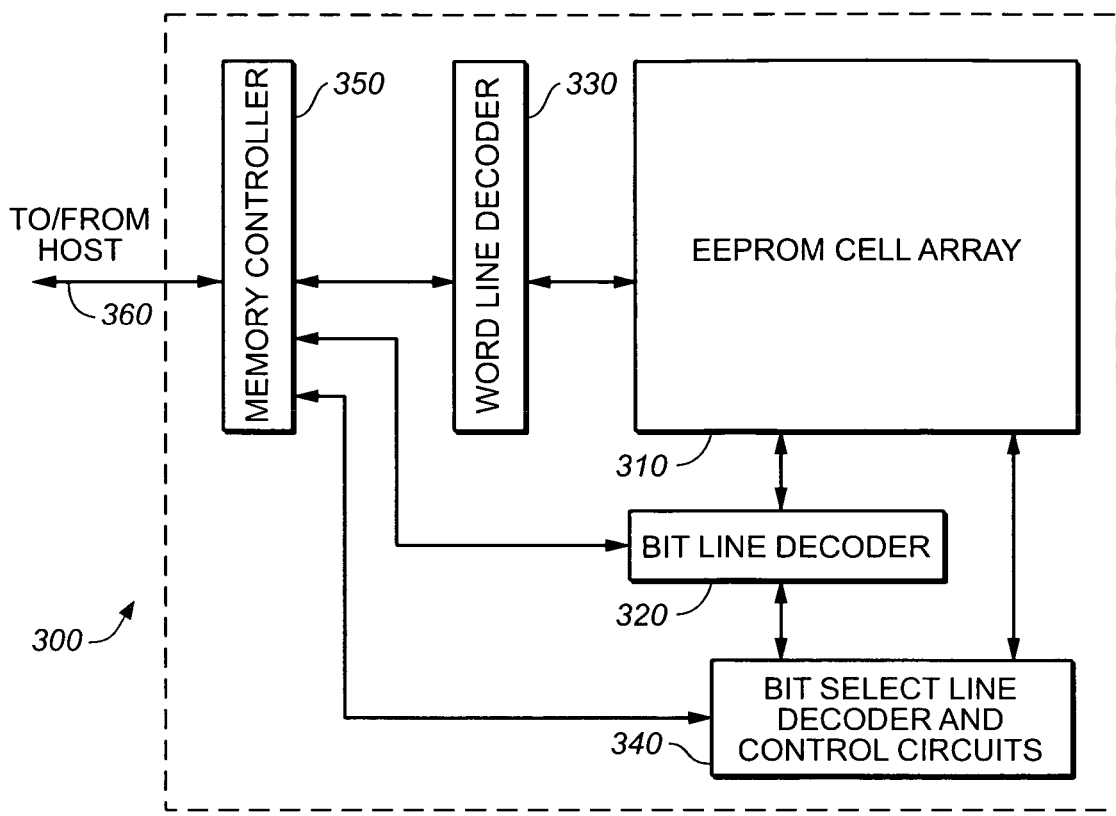
FIG._3a
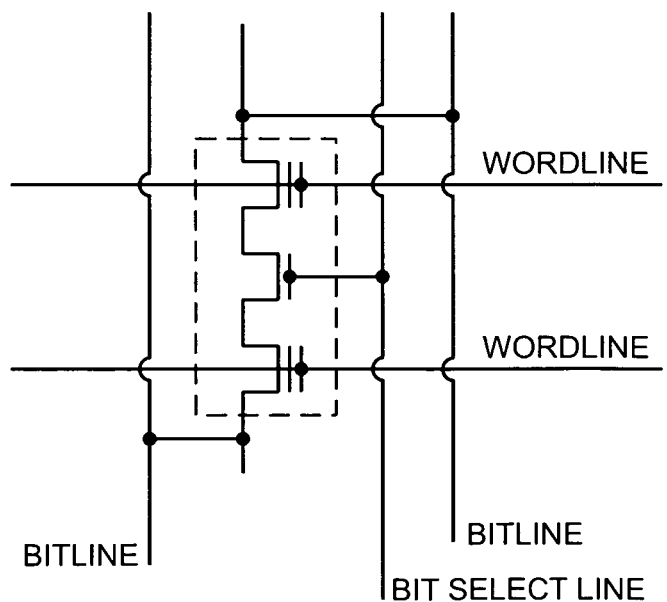
FIG._3b

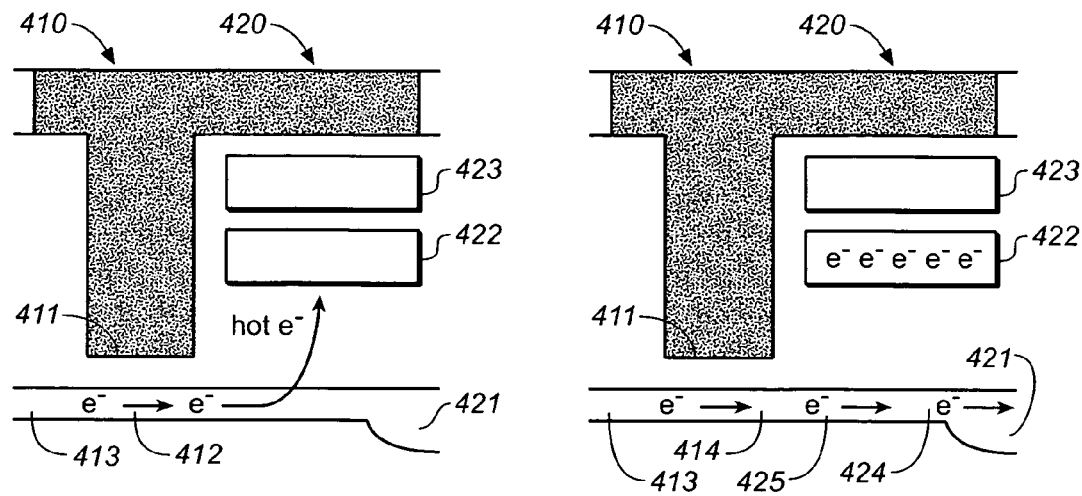
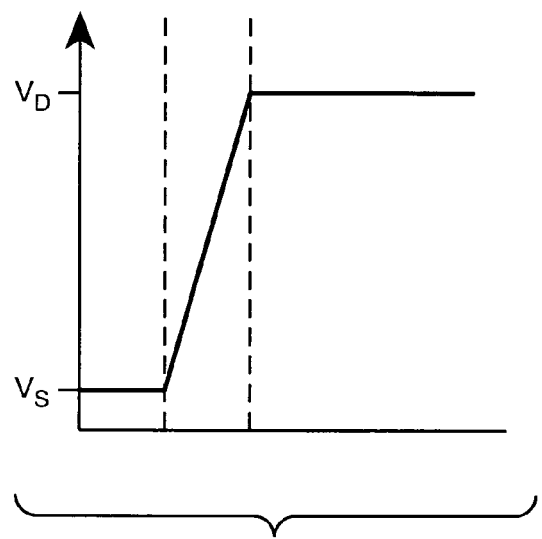
FIG._4a
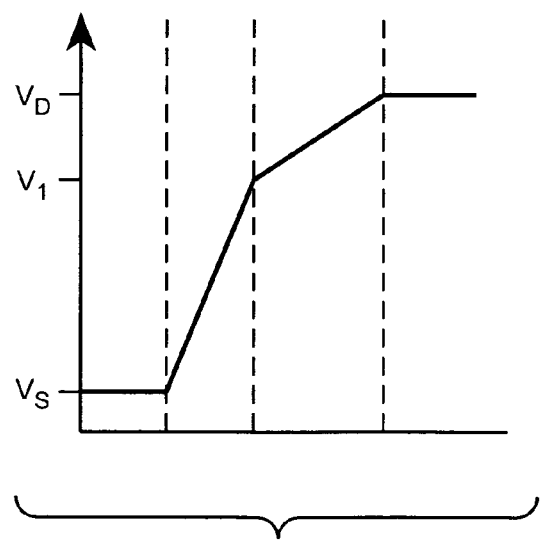
FIG._4b

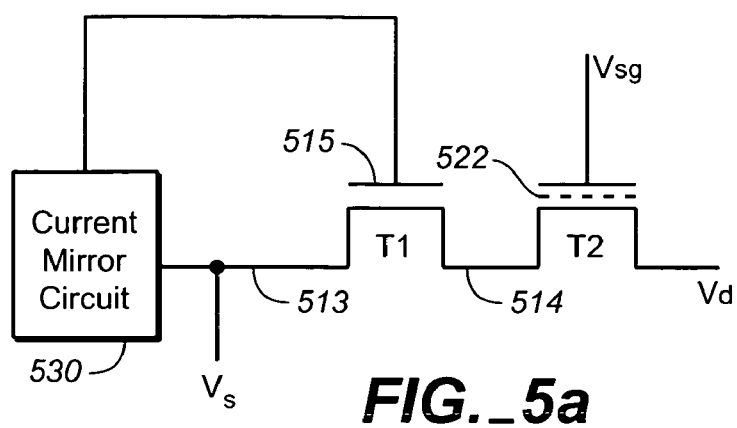
FIG._5a
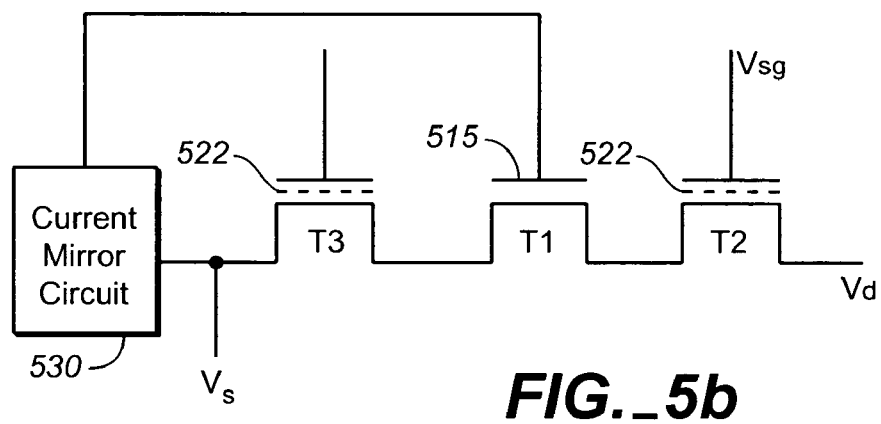
FIG._5b
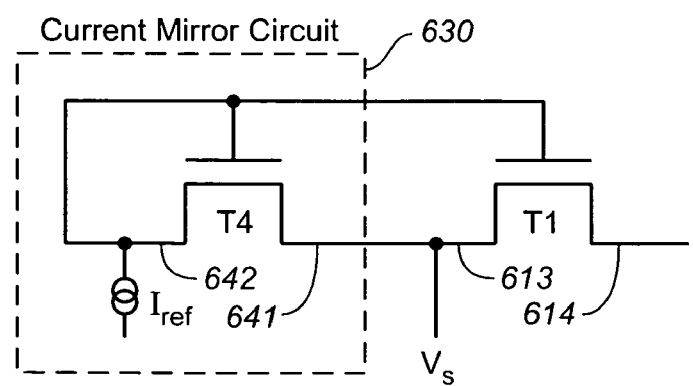
FIG._6

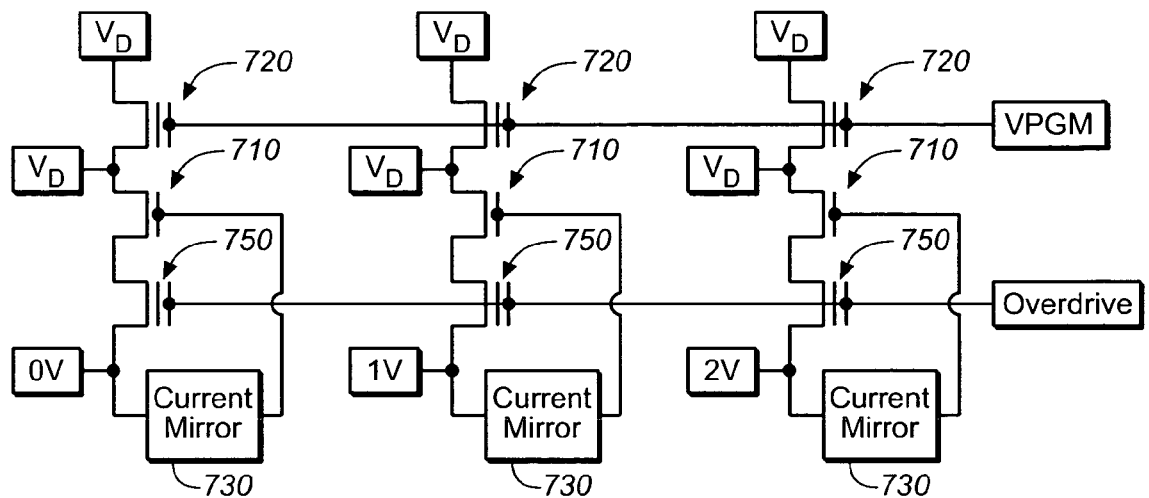
FIG._7a
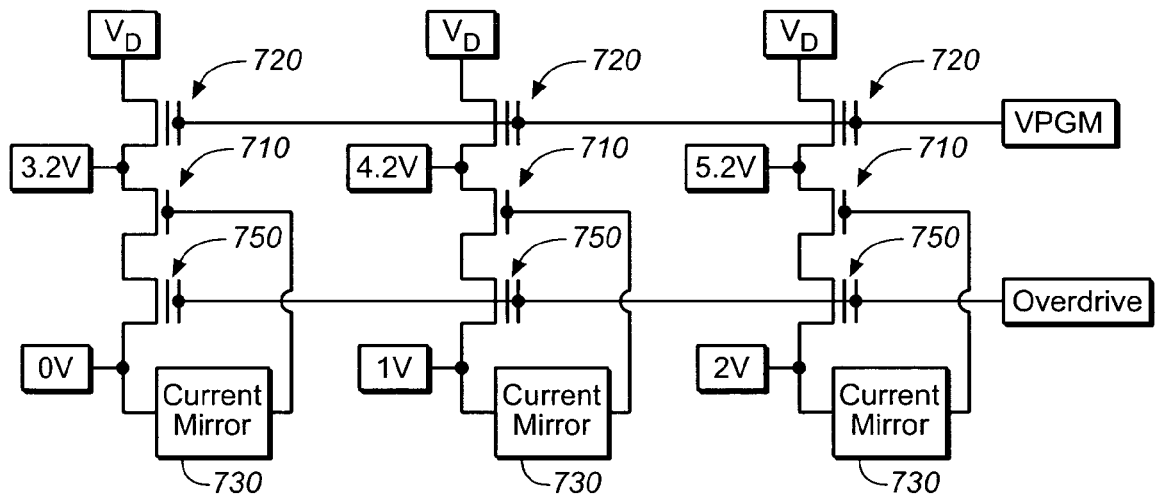
FIG._7b
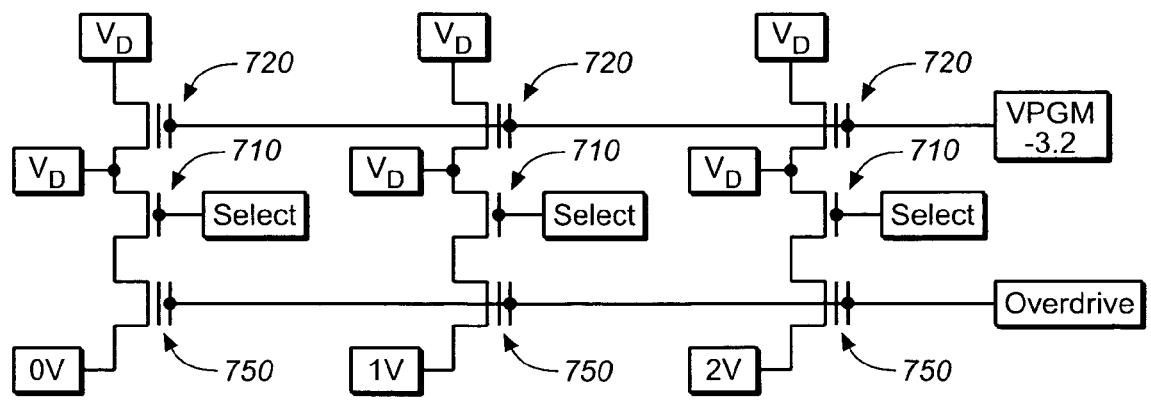
FIG._7c

SOURCE CONTROLLED OPERATION OF NON-VOLATILE MEMORIES

CROSS-REFERENCE TO RELATED APPLICATION

This application is a continuation of application Ser. No. 10/600,988, filed Jun. 20, 2003, now U.S. Pat. No. 6,950,348 which application is incorporated herein in its entirety by this reference.

FIELD OF INVENTION

The invention relates to programming floating gate memory cells, and in particular to improved techniques of reading and writing of dual floating gate memory cells.

BACKGROUND OF THE INVENTION

There are many commercially successful non-volatile memory products being used today, particularly in the form of small cards, which use an array of flash EEPROM cells. The basic architecture of an individual EEPROM memory cell includes source and drain diffusions, coupled by a channel, formed in a semiconducting substrate. The charge storage unit itself is positioned above the channel, separated from it by a dielectric layer. This charge storage unit is often referred to as a floating gate. Overlying the charge storage unit there can be a control gate, used to address the individual cell for programming and reading.

Some designs include a split channel architecture, as described, for example, in U.S. Pat. No. 5,095,344, granted to E. Harari, which is incorporated herein by this reference in its entirety. In a split channel cell both the charge storage unit and the control gate partially overlie the channel. This design has the advantage of simplicity, but the control gate performs the multiple functions of addressing the individual cells to be programmed or read, as well as the function of participating in the actual programming or reading of the cells.

Another design introduces an additional gate structure. This additional gate partially overlies the channel region and partially overlies the control gate. The portion that overlies the channel region forms a transistor that performs a selecting function. Therefore, this is generally called the select gate. The control gate is often called a "steering gate" in this arrangement. The select gate to carries out the addressing function and even may contribute to the programming, but the primary programming and reading functions are performed by the steering gate, as described, for example, in U.S. Pat. No. 5,313,421, granted to D. Guterman et al., which is incorporated herein by this reference in its entirety. This kind of memory cell is illustrated schematically in FIG. 1(a). The corresponding device structure is shown in FIG. 1(b).

Higher storage densities can be achieved by a dual cell design, as described, for example, in U.S. Pat. No. 5,712,180, granted to D. Guterman et al., which is incorporated herein by this reference in its entirety. There are two floating gates per cell in the dual cell architecture, overlying portions of the same channel. Corresponding steering gates are positioned above the floating gates. The select gate is formed above the steering gates and also overlies the channel itself. This type of memory cell is illustrated schematically in FIG. 2(a). The corresponding device structure is shown in FIG. 2(b).

In an array of cells the select gates of the memory cells along a row are usually coupled to form a wordline along that row. The diffusions in different rows are aligned and coupled to form bitlines that run along columns. Also, the steering gates in different rows are aligned and coupled to form steering lines that run along columns. A recent design of a memory cell array is described in U.S. Pat. No. 6,151,248, granted to E. Harari, which is incorporated herein by this reference in its entirety.

An alternative architecture is described in U.S. Pat. No. 6,091,633 granted to Cernea. Steering gates are connected along rows to form wordlines and select gates are connected together along columns to form bit selection lines. This is the reverse of the conventional arrangement. The diffusions in different rows are aligned and coupled to form bitlines that run along columns as in the conventional arrangement. This array architecture has certain advantages over conventional arrangements. The advantages of this arrangement as applied to embodiments of the present invention are further described in the description section.

Typically, each floating gate holds one bit of information. That is, the floating gate is either charged or not, representing a one or a zero. Alternatively, higher storage density may be achieved by using a range of charge levels to represent a range of memory states. Such a system is described in patent application Ser. No. 09/793,370 (publication number 20020118574) by Gongwer, filed on Feb. 26, 2001.

Flash EEPROM memories hold some key advantages over other types of memory systems. One of these advantages is the non-volatile nature of the data storage, making these systems prime candidates for a wide variety of applications, including digital cameras, recording music and utilization in mobile communications. Flash EEPROM is frequently used in memory cards that can be inserted or removed from such devices while maintaining the data stored in the memory.

A characteristic of flash memory systems is, however, the relatively long time it takes to program the cells. Programming can take as long as 10–1000 microseconds, longer than, for example, present day DRAMs.

Many cells are programmed simultaneously in the memory systems. The cells of the array are selected for programming in a certain scheme. The speed of the programming is influenced by this scheme. In some arrays the simultaneous programming is performed, for example, on every fourth, or every seventh cell only. Therefore these schemes require four or seven programming cycles to program all the cells of the array, respectively. One approach to increasing the speed of programming is to program adjacent cells at the same time. This is described, for example, in U.S. Pat. No. 6,493,269 by Cernea, which is incorporated herein by this reference in its entirety. However, the individual programming cycles may still be time consuming even if the number of cycles is reduced.

Thus, programming schemes that program memory arrays more rapidly than conventional schemes are desired.

Conventional techniques for programming memory cells use programming steps followed by verification steps to achieve the required memory state. Several such steps may be required to program a cell in this manner. This can be time consuming. Therefore, reducing the number of verification steps, or eliminating the need for verification, is desired.

SUMMARY OF INVENTION

A technique for programming memory cells incorporating charge storage units is disclosed. The technique involves generating hot electrons in a first transistor of the cell to charge the charge storage unit of a second transistor in such a way that the process is self-limiting. This means that when the charge in the charge storage unit reaches some predetermined level, charging stops or decreases to a very low level. The self-limiting effect is achieved by maintaining a constant current and voltage to the cell so that an increase in voltage across the second transistor as the charge storage unit charges results in a drop in voltage across the first transistor. The voltage across the first transistor produces hot electrons. Therefore, as the voltage across the first transistor drops, fewer hot electrons are produced. Eventually, the production of hot electrons stops or is reduced to a very low level. Thus, the process may self-limit at a charge level proportional to the voltage applied.

The final charge produced by the self-limiting process in the charge storage unit depends on the voltage across the cell during the charging process. By holding the voltage at one side of the cell at a fixed voltage, the final charge may be made dependent on the voltage at the other side. That is, a constant voltage is maintained at one side of the cell and a data-dependent voltage is supplied to the other side. The data-dependent voltage may represent a binary logic state or an analog logic state. The resulting charge in the charge storage unit may also represent either a binary or analog logic state.

Two and three transistor cells may be used according to different embodiments. The self-limiting technique may be used for a two transistor design as described above, or in a three transistor design by turning on the transistor that has a charge storage unit not being programmed so that it is not involved in the process.

A constant current may be provided by controlling the transistor that produces hot electrons. This is done by a current mirror circuit using a reference current. The resistance of this transistor is reduced by the current mirror to maintain a constant current as the resistance of the transistor with the charge storage unit increases as a result of the increasing charge in the charge storage unit.

BRIEF DESCRIPTION OF DRAWINGS

FIG. 1(a) illustrates schematically a two transistor memory cell of the prior art.

FIG. 1(b) shows the structure of a two transistor memory cell of the prior art.

FIG. 2(a) illustrates schematically a three transistor memory cell of the prior art.

FIG. 2(b) shows the structure of a three transistor memory cell of the prior art.

FIG. 3(a) illustrates an example of a memory system using the present invention.

FIG. 3(b) illustrates schematically the configuration of a memory cell within an array of such cells.

FIG. 4(a) shows a memory cell according to one embodiment of the present invention at the start of programming where hot electrons are generated and go to the charge storage unit.

FIG. 4(b) shows a memory cell according to one embodiment of the present invention at the end of programming where hot electrons are no longer produced and the charge storage unit is charged.

FIG. 5(a) illustrates schematically a two transistor memory cell according to an embodiment of the present invention with a current mirror circuit maintaining constant current and a programming voltage.

FIG. 5(b) illustrates schematically a three transistor memory cell according to an embodiment of the present invention with a current mirror circuit maintaining constant current and a programming voltage.

FIG. 6 illustrates a current mirror circuit according to an embodiment of the present invention.

FIG. 7(a) shows memory cells according to an embodiment of the present invention at the start of programming.

FIG. 7(b) shows memory cells according to an embodiment of the present invention at the end of programming.

FIG. 7(c) shows memory cells according to an embodiment of the present invention during reading.

DETAILED DESCRIPTION OF EMBODIMENTS

An example of a memory system 300 incorporating the present invention is shown in FIG. 3(a). This example shows an EEPROM cell array 310 with a bit line decoder 320 and a word line decoder 330. A bit select line decoder and control circuit 340 is connected to the array 310 and to the bit line decoder 320. A memory controller 350 is connected to the bit line decoder 320, word line decoder 330 and the bit select line decoder and control circuit 340. The memory controller 350 is also shown connected to a host by connecting lines 360. The host may be a personal computer, notebook computer, digital camera, audio player, various other hand held electronic devices, and the like. The memory system 300 of FIG. 3(a) will commonly be implemented in a card according to one of several existing physical and electrical standards, such as one from the PCMCIA, the CompactFlash™ Association, the MMC™ Association, and others. When in a card format, the lines 360 terminate in a connector on the card that interfaces with a complementary connector of the host device. The electrical interface of many cards follows the ATA standard, wherein the memory system appears to the host as if it was a magnetic disk drive. Other memory card interface standards also exist. As an alternative to the card format, a memory system 300 of the type shown in FIG. 3(a) may be permanently embedded in the host device.

FIG. 3(b) shows an example of a cell 370 of the memory array 310. This example shows a three transistor cell. In the cell 370 of FIG. 3(b) the bit select lines run parallel to the bit lines. This arrangement of bit lines and bit select lines is convenient for arrays using this invention.

FIGS. 4(a) and 4(b) illustrate an embodiment of the present invention where hot electrons from a first transistor 410 charge a charge storage unit 422 in a second transistor 420. The structure shown is part of a three transistor cell like that shown in FIG. 3(b). It will be understood that the method shown is not limited to this particular structure but may be used in two transistor structures and other similar structures.

FIG. 4(a) shows the situation at the start of the programming process. A data-dependent voltage $V_S$ is applied to the source 413 of the first transistor 410. The drain 421 of the second transistor 420 is kept at a higher voltage $V_D$. This causes electrons to flow through the two transistors from left to right in FIG. 4(a). The total current between the transistors 410, 420 is kept constant by a current mirror circuit (not shown in FIG. 4(a)) controlling the first transistor 410. Initially there is no charge in the charge storage unit 422. Therefore, the impedance of the second transistor 420 is low and the voltage is mainly across the first transistor 410. This is shown in the voltage profile of FIG. 4(a). The voltage across the two devices, $V_D$–$V_S$, is shown as being entirely across the first transistor 410 in this illustration. There is no voltage across the second transistor 420 because it is fully turned on as there is no charge on the charge storage unit 422 and the steering gate 423 above the charge storage unit 422 is held at a constant voltage during programming. The voltage on the steering gate 423 is selected to be close to $V_D$.

The high voltage gradient in the first transistor 410 produces hot electrons in the first channel region 412 under the first gate 411. Electrons are accelerated as they move through the first channel region 412. The acceleration they undergo is proportional to the voltage gradient. Electrons with sufficient energy to move from the first channel region 412 to the charge storage unit 422 are considered to be "hot electrons." Typically, this requires approximately 3.2 electron-volts of energy. This means that the electrons must pass through a voltage of about 3.2 volts in the first channel region 412 under the first gate 411 in order to have enough energy to reach the charge storage unit 422. If the voltage across the first transistor 410 is less than this then production of hot electrons is reduced. If the voltage across the first transistor 410 is increased above 3.2 volts the number of hot electrons increases. In the initial state of the cell, with no charge in the charge storage unit 422 and a sufficiently large value of $V_D$–$V_S$, hot electrons are produced in the first transistor 410 and are supplied to the charge storage unit 422 of the second transistor 420.

As electrons are supplied to the charge storage unit 422 it becomes negatively charged as shown in FIG. 4(b). This charge causes an increase in the impedance of the second channel region 424 under the charge storage unit 422. Because of this impedance, a voltage difference develops between the source 425 and drain 421 of the second transistor 420. This in turn causes a drop in the voltage between the source 413 and drain 414 of the first transistor 410. This is because the total voltage difference across the two transistors 410, 420 remains constant, $V_D$–$V_S$, and as the voltage across one transistor increases the voltage across the other drops. This is shown in the voltage profile of FIG. 4(b) where $V_1$ is the voltage at a point between the two transistors 410, 420. Initially, the voltage at this point is equal to $V_D$ because the first transistor 410 has a high impedance and the second transistor 420 has a low impedance. As the impedance of the second transistor 420 increases and the impedance of the first transistor 410 decreases, $V_1$ changes to some intermediate voltage between $V_D$ and $V_S$. In the voltage profile of FIG. 4(b) $V_D$–$V_1$ is the voltage across the second transistor 420 due to the charging of the charge storage unit 422. $V_1$–$V_S$ is the resulting voltage across the first transistor 410.

As the voltage difference between the source 413 and drain 414 of the first transistor 410 diminishes, the number of hot electrons produced also diminishes. This is because the reduced voltage gradient does not provide as many electrons with sufficient energy to reach the charge storage unit 422. Because the minimum energy needed to reach the charge storage unit 422 is approximately 3.2 electron volts, 3.2 volts is a cut-off voltage for hot electron production. When the voltage between the source 413 and drain 414 of the first transistor 410 reaches approximately 3.2 volts, hot electrons are no longer produced in the first transistor 410 and the charging of the charge storage unit 422 by hot electrons stops. Therefore, this process is self-limiting. Thus, the final charge does not depend on the length of time that the charging voltage is applied. The final charge is largely independent of this time. Therefore, precise timing is not needed. Also, since the charge is self-limited at the required level verification of the charge level is unnecessary, or at least, is not required as frequently as in previous techniques. It will be understood that the cut-off for production of hot electrons may not be abrupt and that charging of the floating gate may continue at a low level after this point is reached. However, the hot electron production is, at least, considerably reduced.

The charge stored in the charge storage unit 422 by the self-limiting process is a function of $V_D$–$V_S$. Here, $V_D$ is held constant so the charge depends on $V_S$, the voltage at the source 413 of the first transistor 410. So, applying a particular voltage to the source 413 produces a predictable charge in the charge storage unit 422. The charge storage unit 422 continues charging until a sufficient charge builds up to stop the process. The charge needed to do this is a function of the voltage applied to the source $V_S$. The cut-off point for the self-limiting process comes when the voltage across the first transistor 410 reaches about 3.2 volts. At that point, the voltage across the second transistor 420 is $V_D$–$V_S$–3.2. Therefore, the final charge on the charge storage unit 422 is proportional to $V_D$–$V_S$–3.2. So, this charge stored can be set to different levels by varying $V_S$, the programming voltage used. Thus, the charging process is self-limiting at a charge level that corresponds to the value of $V_S$ used. In a multi-state system the data-dependent voltage represents one of various possible logic states. In an analog system the data-dependent voltage may be any voltage from a continuum of possible voltage levels. Charge levels in the charge storage units may correspond to particular logic states, whether binary or analog.

The self-limiting aspect of this technique offers several advantages. Firstly, there is less need to verify the programmed charge level. The prior art typically uses a series of voltage pulses to charge the charge storage unit 422. Overcharging the charge storage unit 422 may occur if the voltage pulses are not stopped when the charge storage unit is at the required charge. To ensure that overcharging does not occur the charge in the charge storage unit 422 is checked during the programming routine in what is known as a verify step. This may be done several times during programming. This may be quite time consuming. The self-limiting technique may either eliminate the need for verification or reduce the need so that fewer verification steps are needed.

A second advantage is that several cells may be programmed in parallel to different levels using the self-limiting method. In the typical prior art technique, programming must be stopped at the critical time to prevent overcharging. If different cells are to be programmed to different levels their respective programming signals must be stopped at different times. This makes parallel programming difficult. In the present embodiment, each cell will stop charging when it reaches the appropriate level. Hence, a group of cells may be charged at the same time.

Memory cells may also be read in parallel with this type of cell. A constant voltage may be supplied to one side of the cells. The steering gate 423 corresponding to the charge storage unit 422 to be read is then held at a constant voltage. The other two transistors of the cell are turned on, that is, they are supplied with a sufficient voltage to produce a low impedance in the region below their respective gates.

FIG. 5(a) shows one embodiment of the present invention. This embodiment has a two-transistor memory cell where one transistor has a charge storage unit 522. A current mirror circuit 530 is connected to the source 513 of the first transistor T1 to provide a constant current through the two transistors T1 and T2. The current mirror controls current by regulating the voltage to the gate 515 of T1 to vary the current flowing between the source 513 and drain 514 of T1. A programming state dependent voltage $V_S$ is also connected to the source 513 of T1. This is used to program the charge storage unit 522 to the required state. A constant voltage $V_D$-$V_S$ is maintained across the two transistors, T1 and T2. Also, the current between the transistors is constant. In other words, the total resistance of the two transistors is kept constant. The resistance of T2 is initially close to zero but increases as the charge storage unit 522 acquires charge. As T2 increases in resistance, the resistance of T1 is reduced by the current mirror circuit 530 as it maintains a constant current. As described above, this process is self-limiting because once the resistance of transistor T1 drops to a certain level, and the voltage between its source 513 and drain 514 drops accordingly, there comes a point where hot electrons are no longer produced and the charging of the charge storage unit 522 stops.

FIG. 5(b) shows another embodiment of the present invention. This has a three transistor memory cell having two charge storage units 522. The current mirror circuit 530 provides a constant current through the three transistors. The current is controlled by controlling the voltage on the gate 515 of T1. In this embodiment only one transistor is programmed at a time. That is, when one of the transistors, T2 or T3 is being programmed the other is fully turned on so that it is fully conductive. For example, if T2 is to be programmed then T3 is turned on and becomes fully conductive. In this condition the circuit behaves like that of FIG. 5(a) with the current mirror 530 and $V_S$ being connected to T1. A cross-section of the structure of a three transistor cell like that shown schematically in FIG. 5(b) is shown in FIG. 2(b).

FIG. 6 shows a current mirror circuit 630 that may be used to provide constant current. The current mirror circuit 630 forms a current mirror when connected to the transistor T1. This current mirror has a reference current $I_{ref}$ connected to two transistors, T1 and T4. One of the transistors, T1, is the transistor used to produce hot electrons. The other transistor T4 is chosen to be identical to T1. The current mirror circuit 630 ensures that the current flowing between the source 613 and drain 614 of T1 is the same as that flowing between the source 642 and drain 641 of T4. That is, the current is equal to the reference current $I_{ref}$.

FIGS. 7(a) and 7(b) show the programming and reading of cells in parallel. The cells may be connected as shown in FIG. 3(b). FIG. 7(a) shows the cells at the start of programming. On the top, $V_D$ is applied to one side of each cell. This voltage is applied by the respective bitlines. For example, $V_D$ may be 6.5 volts. The bit line at the other end of each cell is supplied with a programming voltage. In the example shown the programming voltages used are 0 volts, 1 volt and 2 volts. The transistor that is being programmed in each cell is the upper transistor 720 in FIG. 7(a). The steering gate of transistor 720 is supplied with a constant voltage, VPGM. The steering gate of transistor 750 is supplied with an overdrive voltage. This is a voltage sufficient to turn on transistor 750 and so supply the programming voltage to the middle transistor 710. The gate of middle transistor 710 is controlled by the current mirror to provide a constant current through the cell, for example 1 μA. At the start of programming, transistor 720 has no charge in its charge storage unit. Therefore, it has low impedance and the voltage at its source is approximately the same as the voltage at its drain, $V_D$.

FIG. 7(b) shows the cells at the end of programming. The middle transistor 710 of each cell has a voltage of 3.2 volts between its source and its drain. Therefore, hot electrons are no longer produced and charging has stopped. Each of the programmed transistors 720 has a different voltage at its source and a different charge in its charge storage unit. Therefore, each transistor has a different threshold voltage.

FIG. 7(c) shows the cells during reading. A constant voltage is applied to one side of the cells, $V_D$. This may be a different voltage to the voltage used for programming. For example, 3.2 volts may be used for $V_D$ during reading. A constant voltage is supplied to the gate of the programmed transistor. This voltage is VPGM −3.2 volts. Because the gate voltage is reduced by 3.2 volts from the gate voltage used during programming, the source voltage will also drop by 3.2 volts. This results in the voltage at the source of each programmed transistor being the same as the voltage used to program the cell.

Other embodiments of the present invention are possible involving a hybrid of the self-limiting technique with other techniques for programming. For example, the self-limiting technique may be used to quickly program the cell close to its targeted level. The final programming may then be completed by conventional techniques. Conventional techniques use voltage pulses to program the charge storage unit. To ensure the required level of charge is achieved, the voltage is verified as it approaches the target. Therefore, programming involves alternating between applying a pulsed voltage to program, then reading the voltage to see if it is close to the target. This is time consuming but may be done very accurately. A hybrid technique still provides some of the time saving of the self-limiting technique but may also have some advantages of conventional techniques such as greater programming accuracy.

The embodiments described above may be combined with conventional techniques of programming, erasing and reading to improve the speed of the memory. These techniques are not limited to the specific embodiments described above but may be applied in other similar structures. The structures described are not limited to use with the specific methods shown. They may be used in other applications not disclosed here.

What is claimed is:

1. A method of operating an array of non-volatile memory cells, individual cells having charge storage elements that store an amount of charge to indicate a logical state, cells in a row programmed together, comprising:
   providing a first voltage to a first cell of a row, the first voltage selected according to a first logical state to be programmed;
   at the same time, providing a second voltage to a second cell of the row, the second voltage selected according to a second logical state to be programmed; and
   maintaining both the first and second voltages to the first and second cells for a predetermined time period after which the voltages are no longer applied.

2. The method of claim 1 wherein no verification of charge stored in either the first cell or the second cell occurs during the time period.

3. The method of claim 1 wherein constant currents are maintained in the first and second cells during the predetermined time period.

4. The method of claim 1 wherein hot electrons are generated in the first and second cells during the predetermined time period, hot electrons being generated in numbers sufficient to cause significant change in charge levels of charge storage elements of the first and second cells at the beginning of the predetermined time period, hot electrons being generated in reduced numbers that cause no significant change in charge levels of charge storage elements of the first and second cells at the end of the predetermined time period.

5. The method of claim 1 further comprising reading data from the first and second cells by applying constant voltages to the cells and measuring a first output from the first cell and a second output from the second cell, the first output equal to the first voltage, the second output equal to the second voltage.

6. The method of claim 1 wherein the first and second logical states are two logical states selected from four or more logical states that are programmed in the array.

7. A method of managing an array of non-volatile memory cells, a cell having a charge storage element, comprising:
providing a plurality of voltages to a plurality of cells, the plurality of voltages representing logical states to be programmed to the plurality of cells, the plurality of voltages provided to the plurality of cells for a time period, the providing the plurality of voltages to the plurality of cells ending at the end of the time period so that a plurality of charge levels exist in the charge storage elements of the plurality of cells, individual charge levels of individual charge storage elements determined by the voltage applied to the individual charge storage elements.

8. The method of claim 7 wherein the plurality of voltages includes four voltages representing four logical states.

9. The method of claim 7 wherein the plurality of cells are charged by hot electrons that are produced in significant numbers at the start of the time period but are not produced in significant numbers at the end of the time period.

10. The method of claim 7 wherein each cell of the plurality of cells has a charge storage element that starts from a common level and charges to a different charge level during the time period as a result of different voltages provided to individual cells.

11. The method of claim 10 wherein the different charge levels are independent of the time period.

12. A non-volatile memory array that stores data in cells having charge storage elements that contain amounts of charge corresponding to logical states, comprising:
a plurality of cells, individual cells of the plurality having a first transistor that produces hot electrons and a second transistor that has a charge storage element that is charged by the hot electrons from the first transistor;
a plurality of current control circuits, individual current control circuits connected to individual cells to provide constant currents through the plurality of cells during programming of cells;
a plurality of voltage supplies, individual voltage supplies providing data dependent voltages to individual memory cells during programming for a period of time that is the same for each of the plurality of voltage supplies.

13. The non-volatile memory array of claim 12 further comprising a plurality of voltage reading circuits that read voltage outputs from the plurality of cells.

14. The non-volatile memory array of claim 13 wherein the voltage output for an individual cell is equal to the data dependent voltage provided to the cell.

15. The non-volatile memory array of claim 12 wherein an individual current control circuit comprises a current mirror.

* * * * *